United States Patent
Yumoto (10) Patent No.: US 7,776,402 B2
(45) Date of Patent: Aug. 17, 2010

(54) METHOD FOR PATTERN FORMATION AND APPARATUS FOR PATTERN FORMATION

(75) Inventor: Yoshihide Yumoto, Tokyo (JP)

(73) Assignee: Grapac Japan Co., Inc., Tokyo (JP)

( * ) Notice: Subject to any disclaimer, the term of this patent is extended or adjusted under 35 U.S.C. 154(b) by 155 days.

(21) Appl. No.: 11/793,969

(22) PCT Filed: Dec. 27, 2005

(86) PCT No.: PCT/JP2005/023868

§ 371 (c)(1),
(2), (4) Date: Jun. 28, 2007

(87) PCT Pub. No.: WO2006/070791

PCT Pub. Date: Jul. 6, 2006

(65) Prior Publication Data

US 2008/0095934 A1    Apr. 24, 2008

(30) Foreign Application Priority Data

Dec. 28, 2004 (JP) .............................. 2004-381233

(51) Int. Cl.
*B05D 1/02* (2006.01)
(52) U.S. Cl. ...................... 427/402; 427/162; 427/256; 427/264; 118/110; 118/46; 118/642; 118/669; 257/79; 438/502; 264/1.32; 359/647; 425/110; 425/174.4
(58) Field of Classification Search ................. 427/162, 427/256, 264; 118/110, 46, 642, 669; 257/79; 362/555; 438/502; 264/1.32; 359/647; 425/110, 425/174.4
See application file for complete search history.

(56) References Cited

U.S. PATENT DOCUMENTS 4,577,199 A * 3/1986 Saiki et al. .................. 347/215

(Continued)

FOREIGN PATENT DOCUMENTS

JP       62-52501 A       3/1987

(Continued)

OTHER PUBLICATIONS

Chinese Office Action dated Feb. 6, 2009, which issued in the counterpart Chinese Patent Application No. 2005800449908, and an English-language translation thereof.

*Primary Examiner*—Nadine G Norton
*Assistant Examiner*—Mahmoud Dahimene
(74) *Attorney, Agent, or Firm*—Frishauf, Holtz, Goodman & Chick, P.C.

(57) ABSTRACT

The present invention relates to a method for pattern formation and an apparatus for pattern formation, the method comprising: applying, between partition lines for pattern formation formed on a surface of a base member, a resin composition for pattern formation having small compatibility or substantially no compatibility with a resin forming the partition lines for pattern formation, in a state in which the surface of the base member with the partition lines for pattern formation formed whereon is placed face down; maintaining the state in which the resin composition for pattern formation is held on the surface of the base member that is placed face down in order to form the resin composition for pattern formation applied between the partition lines for pattern formation into a downward convex shape; and curing the resin composition for pattern formation that is formed into the downward convex shape in order to form a pattern.

6 Claims, 8 Drawing Sheets

U.S. PATENT DOCUMENTS

| | | | |
|---|---|---|---|
| 4,939,992 A * | 7/1990 | Bird | 101/183 |
| 5,059,266 A * | 10/1991 | Yamane et al. | 156/64 |
| 6,992,718 B1 * | 1/2006 | Takahara | 348/333.09 |
| 2003/0087196 A1 * | 5/2003 | Tsujita et al. | 430/313 |

FOREIGN PATENT DOCUMENTS

| | | | |
|---|---|---|---|
| JP | 04-165301 A | | 6/1992 |
| JP | 05-303153 A | | 11/1993 |
| JP | 07-009654 A | | 1/1995 |
| JP | 2001-301052 A | | 10/2001 |
| JP | 2002-353511 A | | 12/2002 |
| JP | 2002353511 | * | 12/2002 |
| JP | 2003-266627 A | | 9/2003 |
| JP | 2003266627 A | * | 9/2003 |

\* cited by examiner

METHOD FOR PATTERN FORMATION AND APPARATUS FOR PATTERN FORMATION

This application is the United States national phase application of International Application PCT/JP2005/023868 filed Dec. 27, 2005.

TECHNICAL FIELD

The present invention relates to a method for pattern formation and an apparatus for pattern formation, and more particularly to a method for pattern formation for forming a pattern so that, for example, an image formed on a base member can be vividly visible, and an apparatus for pattern formation that is capable of implementing the method for pattern formation.

BACKGROUND ART

In the prior art, there are inventions described in Patent Document 1 (Japanese Unexamined Patent Publication No. H5-303153) and Patent Document 2 (Japanese Unexamined Patent Publication No. H4-165301) regarding a method of producing printed matter having a lens. The inventions described in Japanese Unexamined Patent Publication No. H5-303153 are "a method of producing a three-dimensional image-printed matter, comprising the steps of: printing, on a base sheet surface, a desired image constituted by arranging thereon a plurality of pairs of an image for the right eye and an image for the left eye; printing a resin for a low layer to form a transparent low layer resin section; printing partition lines for pattern formation in a predetermined position of a surface of the lower layer resin section at predetermined intervals; applying a transparent resin for lens formation, which is not compatible with the partition lines for pattern formation, onto the surface of the lower layer resin section; using a repellence obtained due to incompatibility between the partition lines for pattern formation and the resin for lens formation, as well as a surface tension of the resin for lens formation, to arrange the resin for lens formation between the adjacent partition lines for pattern formation in the form of a convex lens; and curing the resin for lens formation to form a plurality of lens sections" (see claim 1 of Patent Document 1), is also "a printed matter with a three-dimensional image, comprising: a base sheet; an image which is provided on a surface of the base sheet and in which a plurality of pairs of an image for the right eye and an image for the left eye are formed; a transparent lower layer resin section that is formed on an image surface; partition lines for pattern formation that are printed on a predetermined position of a surface of the lower layer resin section at predetermined intervals; and a transparent lens section in the form of a convex lens, which is disposed between the adjacent partition line for pattern formation, wherein the lens section is disposed so as to extend between each of the pairs of an image for the right eye and an image for the left eye" (see claim 2 of Patent Document 1), and is "the printed matter with a three-dimensional image, comprising: a transparent base sheet; an image which is provided on the back of the transparent base sheet and in which a plurality of pairs of an image for the right eye and an image for the left eye are formed; partition lines for pattern formation that are printed on a predetermined position of the surface of the transparent base sheet at predetermined intervals; and a transparent lens section in the form of a convex lens, which is disposed between the adjacent partition lines for pattern formation, wherein the lens section is disposed so as to extend between each of the pairs of an image for the right eye and an image for the left eye" (see claim 3 of Patent Document 1).

The inventions described in Patent Document 2 are "a microlens produced by applying a transparent liquid resin onto a pattern formed on a base member, wherein the surface of the pattern formed on the base member and a section in which the pattern is not formed are formed by a material having wetting characteristics different from those of the liquid resin" (see claim 1 of Patent Document 2), and "a method of producing a microlens by applying a transparent liquid resin onto a pattern formed on a base member, the method comprising the steps of: applying a transparent resin having different wetting characteristics to a surface of the pattern and a surface on which the pattern is not formed; and curing the transparent resin after removing excess resin" (see claim 3 of Patent Document 2).

According to the entire description of the specification and the descriptions of the attached drawings provided in each of Patent Document 1 and Patent Document 2, it can be understood that, in the method of producing a printed matter having a three-dimensional image and the method of producing a microlens, the base member is placed with one of its surfaces up, and the partition lines for pattern formation are formed on the top surface, whereby the lens section is formed.

After the inventor of the present application has investigated the above-described inventions, the inventor has discovered that, according to the methods described in Patent Document 1 and Patent Document 2, a lens that forms an image at a focal length of, for example, 0.8 mm or approximately 0.8 mm can be obtained. In this case, the focal length is the same as the total of the thickness of the base sheet or base member and the thickness of the lens. However, the inventor has also discovered that, on a thin base member having a thickness as thin as, for example, 0.1 mm, 0.2 mm or 0.3 mm, a lens whose focal length corresponds to this thickness has to be formed according to use.

On the other hand, Patent Document 3 (Japanese Unexamined Patent Publication No. H7-9654) discloses an offset sheet-fed color perfecting machine. The offset sheet-fed color perfecting machine according to Patent Document 3 comprises "a reverse printing section in which a plurality of reverse printing units are arranged" to print things on the reverse side of a sheet that is fed horizontally (see claim 1 of Patent Document 3). The specific structure of this reverse printing section has "first color and second color reverse printing units 1A and 1B" (see paragraph 0015 of Patent Document 3), and "impression cylinders 11a and 11b of the respective first color and second color reverse printing units 1A and 1B are connected with each other substantially linearly in a horizontal direction via an intermediate cylinder 17a provided with a paper gripping nail, the paper gripping nail being not shown in the figures, whereby a reverse printing section 1 is formed" (see paragraph 0017 of Patent Document 3). According to these descriptions, it is understood that a sheet, on the reverse side of which images in the first color are printed, is conveyed to the impression cylinder 11b, while the reverse side of the sheet contacts with a circumferential surface of the intermediate cylinder 17a. Patent Document 3 does not describe at least the relationship between the intermediate cylinder 17a and the conveyed sheet.

Patent Document 4 (Japanese Unexamined Patent Publication No. 2003-266627) also discloses "a sheet-fed printing press" used for both-side printing. The sheet-fed printing press described in Patent Document 4 has "four intermediate cylinders 3a through 3d in an intermediate section between a reverse printing device (reverse printing section) 1 and a surface printing device (surface printing section) 2" (see paragraph 0019 of Patent Document 4), and employs a configuration in which "the intermediate cylinders 3b and 3d that are placed in the intermediate section between the reverse printing device 1 and the surface printing device 2 are each formed as a suction drum having a suction function on an outer circumferential surface thereof, and a traveling sheet 4 is adhered and held onto the outer circumferential surfaces of the intermediate cylinders 3b and 3d" (see paragraph 0023 of Patent Document 4). According to these descriptions, it is understood that the printed face of the sheet after reverse printing, i.e. the reverse side of the sheet, is in contact with the circumferential surface of the intermediate cylinder 3a, and in this state the sheet that has been subjected to reverse printing is transferred to the next intermediate cylinder 3b.

Patent Document 1: Japanese Unexamined Patent Publication No. H5-303153

Patent Document 2: Japanese Unexamined Patent Publication No. H4-165301

Patent Document 3: Japanese Unexamined Patent Publication No. H7-9654

Patent Document 4: Japanese Unexamined Patent Publication No. 2003-266627

DISCLOSURE OF THE INVENTION

Problems to be Solved by the Invention

An object of the present invention is to provide a method for pattern formation which can produce special visual effects such as the stereoscopic effect and the moiré effect when an image formed on a base member is observed through the pattern, a method for pattern formation which can be applied to charge coupled device image sensors, liquid crystal displays, plasma displays, organic EL display devices and the like, and an apparatus for pattern formation.

Means to Solve the Problems

After the inventor has performed various investigations in order to achieve the above object, the inventor speculates as follows. That is, when the thickness B of the base member is shorter than the focal length A of the lens formed on the surface of the base member, a vivid image cannot be viewed even if the lens is formed on the surface of such a thin base member, because the lens section, which is formed so as to be convex toward an upper side surface of the horizontally disposed base member, does not have a desired shape. The inventor further speculates that when the liquid resin for lens formation is applied to the top surface of the base member extending in the horizontal direction, the shape of the lens section to be formed is slightly flattened by gravity.

The present invention has been completed based on the above-described knowledge. Specifically, in order to achieve the object described above, the first means is a method for pattern formation, comprising: applying, between partition lines for pattern formation formed on a surface of a base member, a resin composition for pattern formation having small compatibility or substantially no compatibility with a resin forming the partition lines for pattern formation, in a state in which the surface of the base member with the partition lines for pattern formation formed is placed face down; maintaining the state in which the resin composition for pattern formation is held on the surface of the base member that is placed face down in order to form the resin composition for pattern formation applied between the partition lines for pattern formation into a downward convex shape; and curing the resin composition for pattern formation that is formed into the downward convex shape in order to form a pattern.

The second means is a method for pattern formation, comprising: forming a first undercoating layer on a surface of a base member and then forming a second undercoating layer on the surface having the first undercoating layer wherein said second undercoating layer has broken parts at predetermined intervals through which parts of the first undercoating layer are exposed; applying a resin composition for pattern formation that has small compatibility or substantially no compatibility with the first undercoating layer but has compatibility with the second undercoating layer, in a state in which the surface of the base member having the first undercoating layer and the second undercoating layer is placed face down; maintaining the state in which the resin composition for pattern formation is held on the faced-down second undercoating layer in order to form the resin composition for pattern formation held on the second undercoating layer into a downward convex shape; and curing the resin composition for pattern formation that is formed into the downward convex shape in order to form a pattern.

The third means is the method for pattern formation according to the first or second means, wherein the pattern is a convex lens.

The fourth means is an apparatus for pattern formation, having: a pattern formation resin composition applying section for applying a resin composition for pattern formation to a surface of a base member in a state in which the surface of the base member is placed face down; and a curing section for forming a pattern by curing the resin composition for pattern formation provided on the base member, which is transferred in a state in which the resin composition for pattern formation applied to the faced-down surface of the base member is held on the bottom surface of the base member, wherein a top surface printing section that performs printing on a top surface of the base member is not provided.

The fifth means is the apparatus for pattern formation according to the fourth means, wherein the pattern is a convex lens.

ADVANTAGES OF THE INVENTION

According to the present invention, when the resin composition for pattern formation is applied to the bottom surface of the base member in which the surface of the base member is placed face down, and the position of the surface applied with the resin composition for pattern formation is maintained, the applied resin composition for pattern formation is formed into a downward convex shape due to the actions of both gravity and surface tension of the resin composition for pattern formation and the partition lines for pattern formation, and the resin composition for pattern formation that is formed into a downward convex shape is cured in such a state. Therefore, a downward convex pattern is formed so as to have a combined shape obtained from a spherical shape due to the spheronization phenomenon caused by the surface tension of the resin composition for pattern formation and from a catenary shape caused by gravity. This shape has the function of a convex lens.

As in the conventional inventions, when the resin composition for pattern formation is applied to the top surface of the base member in a state in which the top surface of the base member is placed face up, the resin composition for pattern formation is formed into a slightly flat and convex pattern due to the action of gravity. Accordingly, a lens-like pattern which has long focal length or in which a focal point is not focused on a desired position is formed. The present invention can resolve disadvantageous phenomena based on such pattern formation, including a disadvantage that a stereoscopic image or an image formed by a moiré effect cannot be observed clearly. In other words, the method for pattern formation and the apparatus for pattern formation according to the present invention can produce a pattern-printed matter in which the resin composition for pattern formation that is applied to the bottom surface of the base member forms a downward convex lens having a composite curved surface due to the actions of the surface tension and gravity, thus a figure that is formed on the thin base member in accordance with the focal length of the lens can be observed clearly.

EXPLANATION OF REFERENCE NUMERALS

1 . . . base member; 2 . . . image; 3 . . . patterns; 4 . . . first undercoating layer; 5 . . . pattern partition formation lines; 5b . . . second undercoating layer; 6 . . . resin composition for pattern formation; 7 . . . patterns; 8 . . . patterns; 9 . . . apparatus for pattern formation; 9A . . . apparatus for pattern formation; 10 . . . pattern formation resin applying section, 11 . . . base member conveying section; 12 . . . curing section; 13 . . . impression cylinder; 14 . . . blanket cylinder; 15 . . . roller; 16 . . . sheet; 16A . . . sheet; 17 . . . conveying cylinder; 20 . . . pattern formation partition line applying section; 21 . . . roller; 22 . . . partition line transfer roller; 23 . . . first roller; 24 . . . first undercoating layer forming section; 25 . . . second undercoating layer forming section; 26 . . . roller; 27 . . . feed roller; 28 . . . feed roller; 29 . . . feed roller; 30 . . . conveying second cylinder, 31 . . . mercury lamp

BEST MODE FOR CARRYING OUT THE INVENTION

First Embodiment

The method for pattern formation according to an example of the present invention has the steps of: (1) applying a resin composition for pattern formation to a surface of a base member in a state in which the surface of the base member is placed face down; (2) maintaining the position of the surface of the base member to which the resin composition for pattern formation is applied; and (3) curing the resin composition for pattern formation that is formed on a predetermined pattern on a lower side surface of the base member.

[First Step]

The first step is a step of applying a resin composition for pattern formation to a surface of a base member in a state in which the surface is placed face down.

In a pattern-printed matter obtained by means of the method of the present invention, an image that is formed on one side of a base member is observed through a lens-like cured material obtained by curing the resin composition for pattern formation formed on the other side of the base member, thus it is preferred that the base member used in this method of the present invention be formed of a transparent or semi-transparent member. An opaque layer may be provided on the other side of the base member, i.e., the other side of the surface on which the pattern is formed, so that, when the image is observed through both the pattern and base member, observation of the image is not interrupted by the background that can be seen through the pattern and base member. The opaque layer is also called "reflecting layer", which is basically a layer having a function of reducing or losing the transparency so that the image cannot be seen through the pattern and base member. This reflecting layer can also improve visibility of the image by reflecting light.

Figure 1:
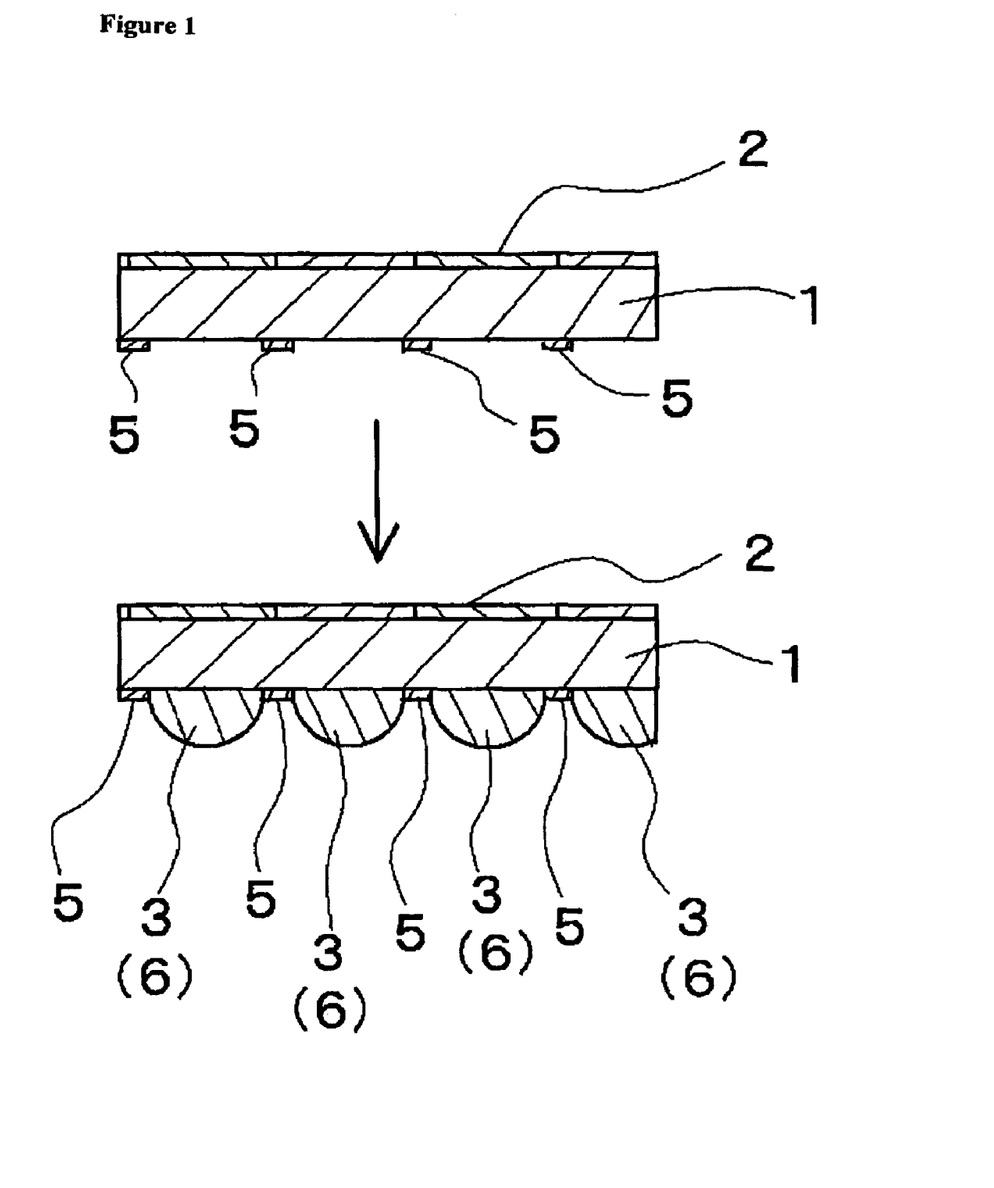
FIG. 1 is an explanatory diagram showing a procedure of the method for pattern formation according to an example of the present invention.

In the first step, as shown in FIG. 1, an image 2 is formed on one of the surfaces of a base member 1, and, on the other side of the base member 1, which is the opposite side of the surface with the image 2, lens-shaped patterns 3 are formed between pattern partition formation lines 5 that are formed at predetermined intervals. In this case, the transparent base member sometimes functions as a supporting body for holding the patterns 3 and has a focusing function for adjusting the focal length so that the focal point of each lens formed by each pattern 3 is positioned on the image. It should be noted that the surface of the image 2 may be provided with an opaque layer, i.e., a reflecting layer (not shown). Even if the base member is transparent, patterns may be formed on the surface of the base member on which the image is formed, depending on the use.

It is preferred that the thickness of the base member be substantially the same as the focal length of the lens which is a cured material of the resin composition for pattern formation, and is usually 0.01 through 0.8 mm in accordance with the focal length of a lens to be formed.

Figure 3:
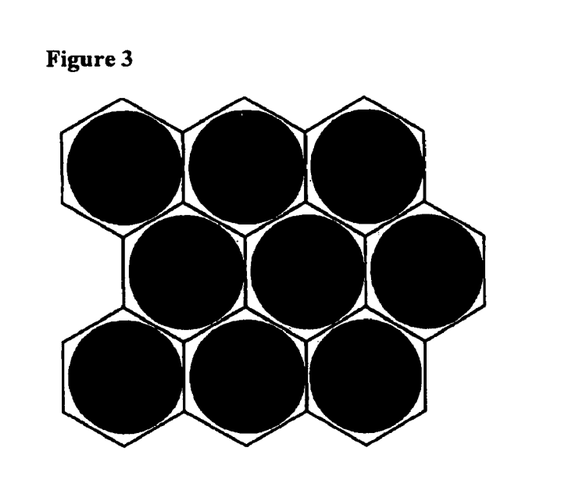
FIG. 3 is an example showing an image formed on a surface of a base member which can be employed in the method of the present invention.
Figure 4:
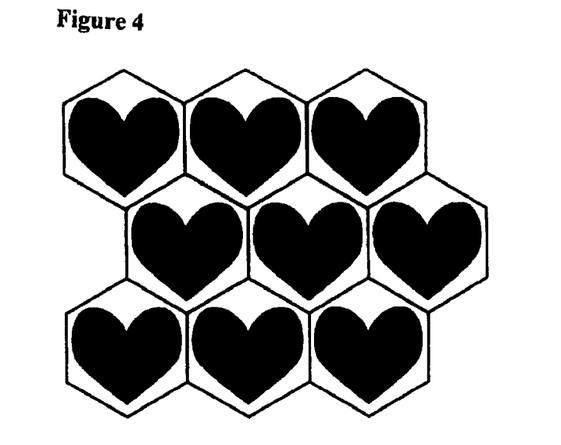
FIG. 4 is an example showing an image formed on a surface of a base member which can be employed in the method of the present invention.
Figure 5:
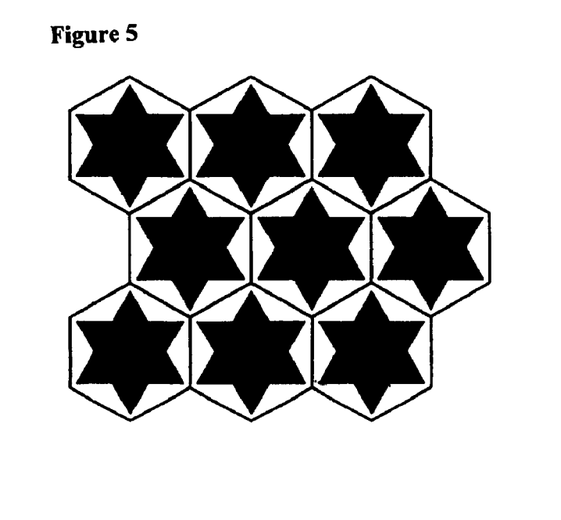
FIG. 5 is an example showing an image formed on a surface of a base member which can be employed in the method of the present invention.
Figure 6:
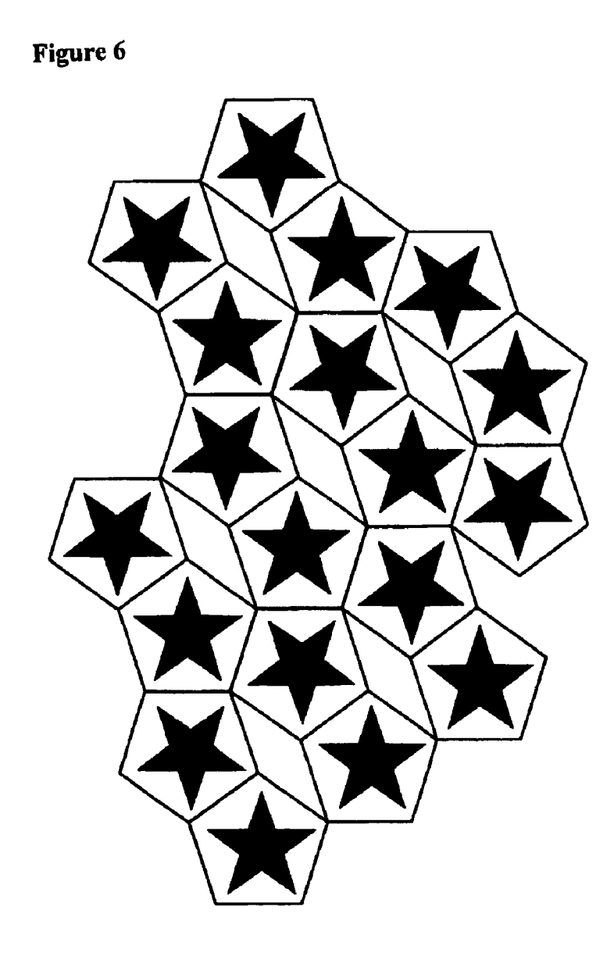
FIG. 6 is an example showing an image formed on a surface of a base member which can be employed in the method of the present invention.
Figure 7:
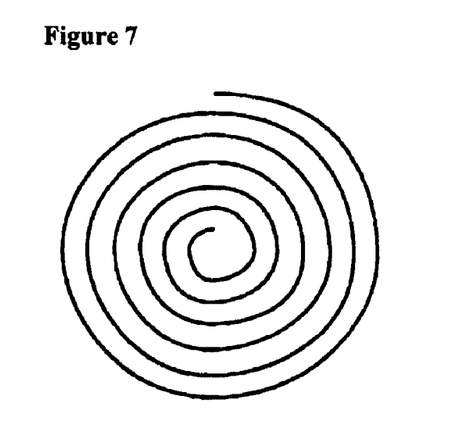
FIG. 7 is an example showing an image formed on a surface of a base member which can be employed in the method of the present invention.
Figure 8:
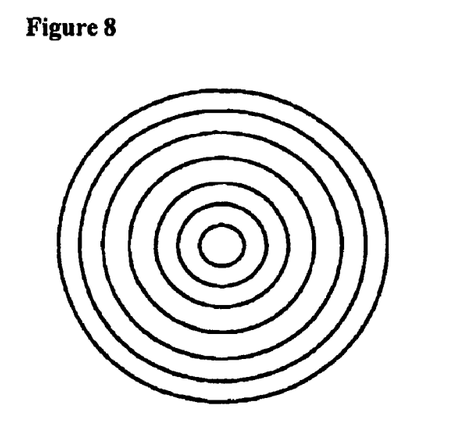
FIG. 8 is an example showing an image formed on a surface of a base member which can be employed in the method of the present invention.
Figure 9:
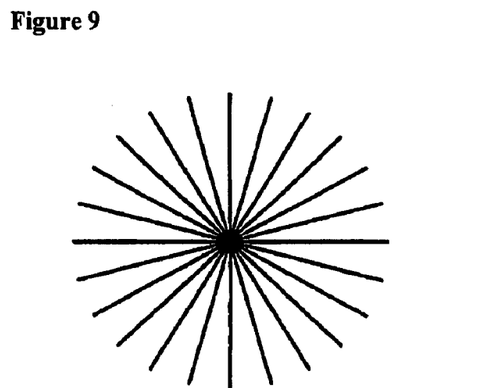
FIG. 9 is an example showing an image formed on a surface of a base member which can be employed in the method of the present invention.
Figure 10:
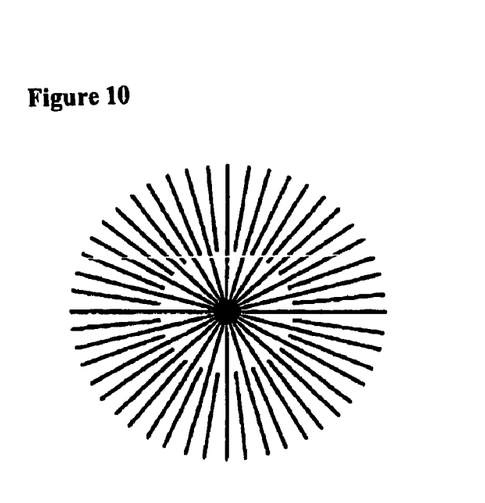
FIG. 10 is an example showing an image formed on a surface of a base member which can be employed in the method of the present invention.
Figure 11:
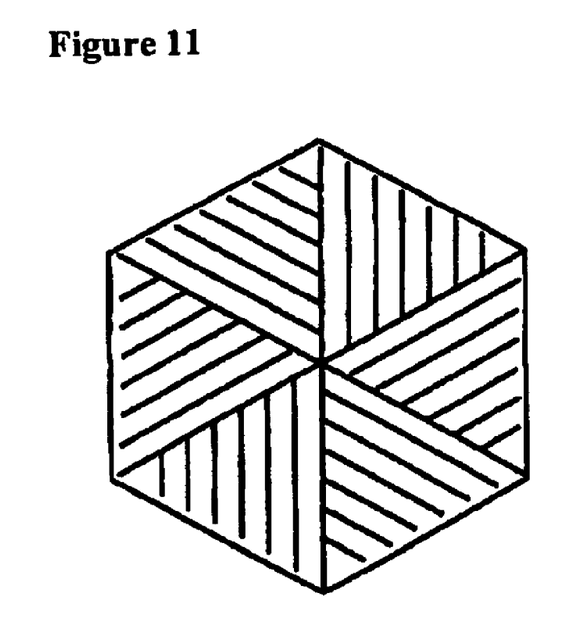
FIG. 11 is an example showing an image formed on a surface of a base member which can be employed in the method of the present invention.
Figure 12:
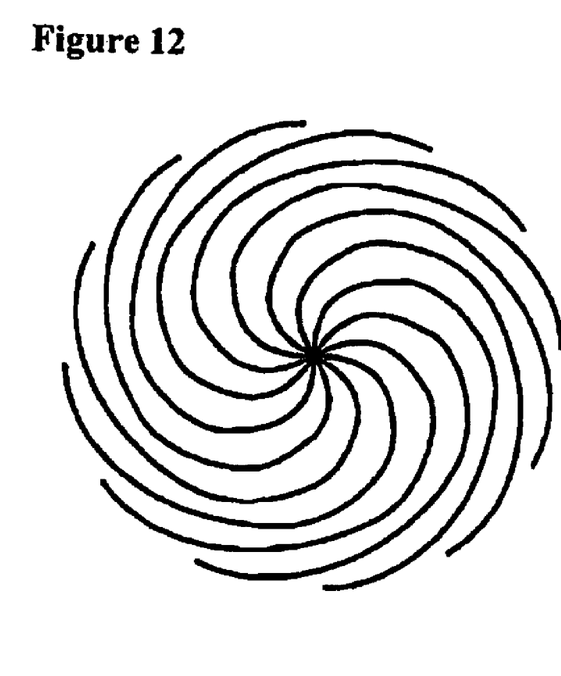
FIG. 12 is an example showing an image formed on a surface of a base member which can be employed in the method of the present invention.

The image formed on the surface of the base member 1 may be various images shown in FIG. 3 through FIG. 12 as long as the stereoscopic effect, the moiré effect or other special visual effects can be obtained by interacting with the patterns. The image shown in FIG. 3 is a figure of a combination of honeycomb figures and circles formed in hexagons forming the shape of the honeycomb figures. The image shown in FIG. 4 is a figure of a combination of honeycomb figures and heart figures formed in hexagons forming the shape of the honeycomb figures. The image shown in FIG. 5 is a figure of a combination of honeycomb figures and star figures formed in hexagons forming the shape of the honeycomb figures. The image shown in FIG. 6 is a figure of a combination of honeycombs which are different from those shown in FIG. 3 through FIG. 5 and star figures formed in pentagons forming the honeycomb figures. FIG. 7 shows an image of a spiral. The image shown in FIG. 8 is a figure of a combination of a plurality of concentric circles. The image shown in FIG. 9 is a figure of a combination of a number of straight lines extending radially from one point. FIG. 10 is an image of a combination of a number of straight lines extending radially from one point and a plurality of shorter straight lines disposed between these straight lines in radial directions. The image shown in FIG. 11 is a figure obtained by combining a regular hexagon, six triangles each of which is formed with the apexes of the regular hexagon and straight lines connected between these apexes and the apex opposite thereto, and a plurality of parallel lines that are so formed in each triangle that the directions thereof are different from those of the plurality of parallel lines formed in adjacent triangles. The image shown in FIG. 12 is a figure formed by a plurality of curved lines extending from one point in radial directions. It goes without saying that the image to be formed on the surface of the base member is not limited to the images shown in FIG. 3 through FIG. 12.

According to the present invention, the base member may be a single layer one or a layered product with a plurality of layers.

In the case in which the base member is a layered product, each layer forming the layered product may be transparent. In either case, the base member which is a layered product composed of a plurality of layers has a function of holding patterns. When lens-shaped patterns are formed on the side opposite to the surface of the base member with an image and the image is observed through the patterns, each layer configuring the base member naturally needs to be transparent.

In the case of a base member configured by stacking two or more transparent layers, at least one of the transparent layers functions as a bearing layer for having patterns thereon, while the rest of the layers function as auxiliary bearing layers for cooperating with the transparent layer which is the bearing layer and improving the bearing power. Depending on circumstances, the rest of the layers sometimes function as focal length adjusting layer for adjusting focal length so that the focal point of each lens-shaped pattern is focused on the image surface.

Therefore, when an image is formed on one side of the base member and the image is observed from the other side of the base member, the self-supporting characteristics of the base member are considered regardless of whether the base member is a single layer one or a layered product, and when the patterns are in the form of a lens, the focal length and the like are considered, whereby the material, thickness and the like of the base member are determined.

The material for the base member is not particularly limited as long as the above-mentioned functions can be achieved and an image can be formed thereon. Examples of the material of the base member composed of a transparent single layer include a synthetic resin, a glass-like or transparent coating film, and the like.

It should be noted that "transparent" here means that the base member has a certain degree of transparency so that the image can be observed, and includes the states of transparent and colorless, semi-transparent, colored and transparent, and colored and semi-transparent.

The shape of the base member may be a flat shape, curved shape, or indented shape.

In the example of the method of the present invention, as shown in FIG. 1, the partition lines for pattern formation 5 are formed, by means of coating, on a surface opposite to the surface of the base member 1 on which the image is formed.

The surface of the base member 1 on which the partition lines for pattern formation are formed is preferably as smooth as possible.

Preferred smoothness of the surface of the base member 1 on which the partition lines for pattern formation are formed can be defined by an arithmetic mean roughness value (Ra value) and a maximum height value (Ry value) defined by JIS B 0601.

A preferred Ra value of the surface of the base member 1 on which the partition lines for pattern formation are formed is 0.001 through 5, and more preferably 0.002 through 0.6. A preferred Ry value is 0.001 through 28, and more preferably 0.002 through 3. It should be noted that, depending on circumstances, 0.001 through 0.6 and 0.002 through 5 can be preferred ranges of the Ra value, and 0.002 through 28 and 0.001 through 3 can be preferred ranges of the Ry value.

When the smoothness of the surface of the base member 1 on which the partition lines for pattern formation are formed is within the above-mentioned ranges, the partition lines for pattern formation and the patterns can be formed effectively by means of a printing method. When the smoothness of the flat surface is low, the function of each pattern itself that is finally formed deteriorates.

When the smoothness of the surface of the base member 1 is not sufficient for the surface for pattern formation, an undercoating layer may be formed on the surface of the base member 1 to obtain smoothness required on the surface for pattern formation.

Such an undercoating layer can be formed by means dipping, brush coating, spraying, coating with a roll coater, printing, or other method.

It should be noted that FIG. 1 shows that the pattern partition formation lines 5 are formed on the bottom surface of the base member 1 which is disposed horizontally, but the pattern partition formation lines 5 may be formed, by means of coating, on a top surface of the base member 1 disposed horizontally. Specifically, when the pattern partition formation lines 5 is formed, the pattern partition formation lines 5 do not have to be formed on the bottom surface of the horizontally placed base member.

The partition lines for pattern formation have a function of suspending the resin composition for pattern formation in a convex shape by repelling the resin composition for pattern formation applied on the bottom surface of the base member in an area surrounded by the partition lines for pattern formation or in a section sandwiched by the partition lines for pattern formation.

For the material for forming the partition lines for pattern formation, various materials can be used as long as fine lines can be adhesively formed on the surface of the base member 1 on which the patterns are formed, i.e. on the surface for pattern formation, and as long as the material is not compatible with the resin composition for pattern formation, which will be described hereinafter, and thus repels the resin composition for pattern formation. Preferable materials for the partition lines for pattern formation may include, for example, rosin-modified phenolic resin, urea resin, melamine resin, ketone resin, polyvinyl chloride resin (PVC), polyvinyl chloride-polyvinyl acetate copolymer resin, polyvinyl butyral resin (butyral resin), styrene-maleic resin, chlorinated polypropylene, acrylic resin, coumarone-indene resin, petroleum resin, polyester resin, alkyd resin, polyamide resin, epoxy resin, polyurethane, cellulose nitrate (pyroxylin), ethyl cellulose, ethylhydroxyethyl cellulose (EHEC), cyclized rubber, and chlorinated rubber.

The shape of the partition lines for pattern formation is in a repetitive form. The repetitive form varies depending on the forms of the patterns.

For example, when a pattern having a function or shape of a lenticular lens is formed, the partition lines for pattern formation thereof may be formed at predetermined intervals so as to be parallel to one another. These parallel partition lines for pattern formation may be straight lines, curved lines in the form of arches, or zigzag lines. When a normal lenticular lens is produced, the partition lines for pattern formation thereof are straight lines formed at predetermined regular intervals so as to be parallel to one another.

When a fly-eye lens is produced, the partition lines for pattern formation are in a repetitive form of a circle or polygon. A preferred example of the repetitive form of a polygon can be a honeycomb figure. For the repetitive form of a polygon, a hexagon, a pentagon, a square, and a triangle are used as the basic units, which are repeatedly formed. Moreover, the partition lines for pattern formation can be formed in the shape of a spiral, and this spiral partition line for pattern formation is a repetitive form based on a certain law.

When a Fresnel lens is manufactured, the partition lines for pattern formation thereof are a plurality of concentric circles. The plurality of concentric circles are in a repetitive form of circles sharing the same center.

It is preferred that the width of each partition line for pattern formation be 0.2 through 250 μm. If the line width is too large, the area of the pattern is relatively reduced, whereby the lens function of the pattern is lowered. If the line width is too narrow, the resin composition for pattern formation that is applied between the partition lines for pattern formation spreads over adjacent partition lines for pattern formation, causing difficulty in forming a lens in each section between the partition lines for pattern formation. When the line width is within the above-mentioned range, the lens can be easily formed independently in each section between the partition lines for pattern formation.

When each interval between the adjacent partition lines is set to 0.2 through 30 μm, it is possible to produce fine patterns having indentations that are too small to feel with a finger when touching the surface.

The method for forming the partition lines for pattern formation is not particularly limited, but it is preferred to employ an etching method, a printing method, or the like. Preferred is the printing method. Examples of the printing method include lithography, relief printing, intaglio printing, gravure printing, screen printing, and stencil printing. When the partition lines for pattern formation that have a small interval or a fine line width as described above are formed, such partition lines for pattern formation are preferably formed by means of lithography or gravure printing.

After the partition lines for pattern formation are formed, the resin composition for pattern formation is applied to a surface for pattern formation having the partition lines.

The important thing here is that the resin composition for pattern formation has small compatibility or substantially no compatibility with a resin that forms the partition lines for pattern formation. In the case in which the resin composition for pattern formation has small compatibility or substantially no compatibility with the resin that forms the partition lines for pattern formation, the applied resin composition for pattern formation is repelled by the partition lines for pattern formation, whereby, as shown in FIG. 1, the resin composition for pattern formation 6 is suspended between adjacent partition lines for pattern formation 5.

Such a resin composition for pattern formation preferably has a contact angle of at least 15 degrees with respect to the material forming the partition lines for pattern formation, and, for example, a polymerizable substance is contained in the resin composition for pattern formation as long as the resin composition for pattern formation has such a contact angle.

The polymerizable substance may be a substance that can be subjected to heat polymerization or radiation-polymerization such as ultraviolet polymerization, and normally has a polymerizable double bond-containing group.

Examples of the polymerizable double bond-containing group include a group having a reactive double bond which is sensitive to and cured by irradiation of active radiations such as an ultraviolet, a visible ray, an electron beam, and an X ray, or by heat.

The group having a reactive double bond, which is the polymerizable double bond-containing group, may be, for example, a functional group having an acryloyl group, (meth) acryloyl group, vinyl group, aryl group, or epoxy group. Examples of the preferred polymerizable double bond-containing group include an acryloyl group, a (meth) acryloyl group, and an epoxy group.

The resin composition for pattern formation preferably has a refractivity of 1.35 through 1.75. If the resin composition for pattern formation has the refractivity within this range, the lenses to be formed as the pattern can sufficiently exert the lens function thereof.

The resin composition for pattern formation according to the present invention preferably contains a contraction inhibitor in order to prevent the resin composition for pattern formation from contracting at the time of curing. As the contraction inhibitor, there is used a substance that has a function of preventing contraction from occurring when the resin composition for pattern formation according to the present invention is cured and a function of not eliminating the transparency of patterns obtained by curing the resin composition for pattern formation.

Examples of the substance having such functions include barium sulfate, silica, alumina white, and calcium carbonate.

As the contraction inhibitor of the present invention, transparent filler can be used.

For the contraction inhibitor or transparent filler, barium sulfate, silica or the like is preferably used.

The resin composition for pattern formation according to the present invention may contain a solvent for adjusting the fluidity of the resin composition for pattern formation. Examples of the solvent that can suitably be used in the present invention include an aromatic solvent such as toluene and xylene, a mineral oil such as mineral spirit, and an alkyl ketone such as dimethyl ketone, methyl ethyl ketone, methyl propyl ketone, and methyl isobutyl ketone.

The suitable resin composition for pattern formation according to the present invention contain, for example, 50 through 95 wt % or preferably 60 through 95 wt % of the polymerizable substance, 0 through 5 wt % or preferably 0.1 through 1 wt % of the contraction inhibitor, and 1 through 15 wt % or preferably 3 through 12 wt % of a polymerization initiator. If each of the above components is within the above-mentioned loading ranges, the viscosity of the resin composition for pattern formation is adjusted to obtain good application property, and appropriate surface tension can be obtained when the resin composition is applied to the pattern formation surface, whereby good patterns can be formed in the form of, for example, a lens. Moreover, the resin composition for pattern formation can be prevented from contracting as much as possible when cured, thus high-definition patterns having optical performance can be produced.

The important thing in the method of the present invention is to apply the resin composition for pattern formation in a state in which the surface side of the base member is placed face down, i.e. in a state in which the pattern formation surface is placed face down, or a state in which the surface on which the partition lines for pattern formation are formed is placed face down.

Figure 13:
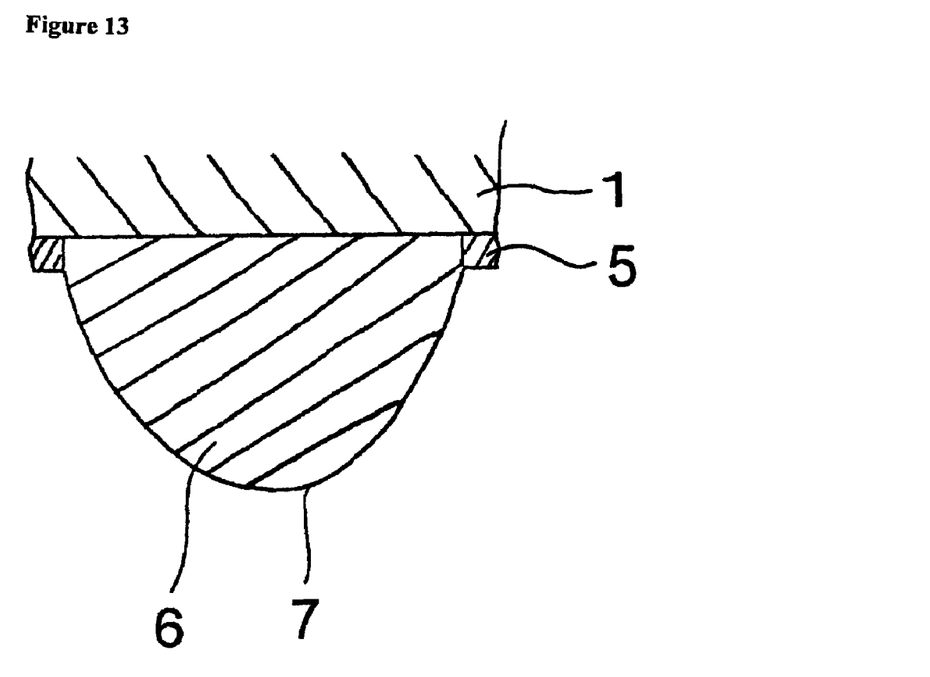
FIG. 13 is a cross-sectional view showing a longitudinal section of the swell that is formed by a resin composition for pattern formation by means of the method of the present invention.

When the resin composition for pattern formation is applied to the pattern formation surface in a state in which the pattern formation surface of the base member is placed face down, the applied resin composition for pattern formation forms, as shown in FIG. 13, a downward convex pattern 7 which is provided with a curved surface due to a composite action, i.e. an action that tries to form a semi-sphere by means of the surface tension of the resin composition for pattern formation 6, and an action that tries to form a catenary curve by means of gravity.

Figure 14:
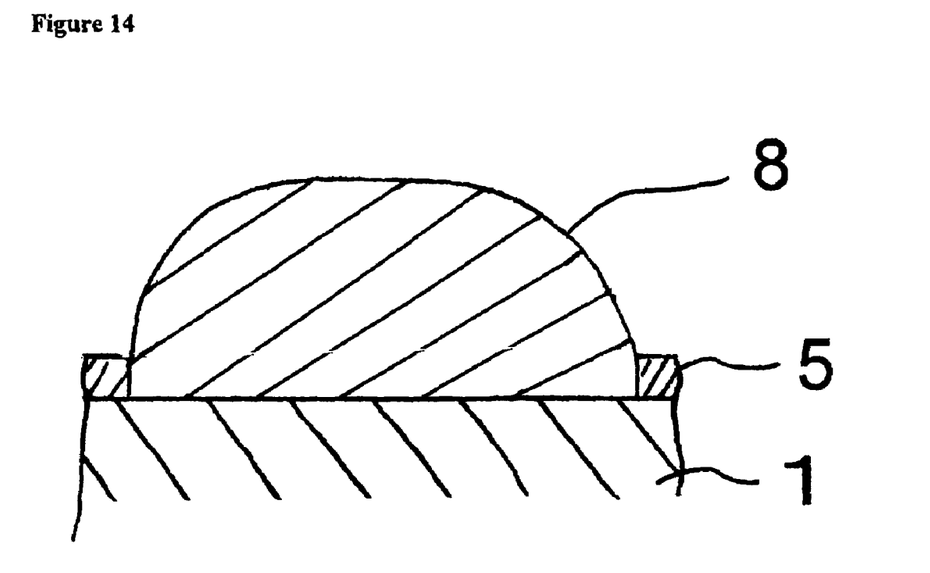
FIG. 14 is a cross-sectional view showing a longitudinal section of the swell that is formed by the resin composition for pattern formation by means of a conventional method.

In the prior art, when the pattern formation surface of the base member is placed face up and the resin composition for pattern formation is applied to this pattern formation surface, a spherical surface is formed by the surface tension of the resin composition for pattern formation, but an upward convex pattern 8 whose top section is substantially flat is formed by the action of gravity as shown in FIG. 14. However, in the present invention, the downward convex pattern 7 that does not have a flat surface but a curved surface is formed as described above.

[Second Step]

The second step is a step of keeping a state in which the applied resin composition for pattern formation is suspended by placing the surface of the base member face down, the surface having been coated with the resin composition for pattern formation. In other words, the second step is to maintain the state in which the suspended resin composition for pattern formation is suspended for a predetermined period of time. In this step, the resin composition for pattern formation, which is applied to the pattern formation surface placed face down, is repelled by the partition lines for pattern formation, and the resin composition for pattern formation is held in the suspended state for a period of time that is required for the applied resin composition for pattern formation to form a catenary or catenary surface by means of the action of gravity. The time period during which the applied resin composition for pattern formation is held in the suspended state is normally 0.1 through 6 seconds. Although the above-mentioned time period may exceed 6 seconds, there is no particular advantage of extending the time period.

[Third Step]

The third step is to cure the resin composition for pattern formation that is formed into a predetermined pattern, such as a lenticular lens, on the bottom surface of the base member.

The pattern formed by the resin composition for pattern formation may be cured by means of heat curing or radiation curing, but the radiation curing technique is preferably employed. An ultraviolet, an electron beam or the like is used as a radiation. The conditions and the like for radiation curing are determined appropriately based on the resin composition for pattern formation.

[Apparatus for Pattern Formation]

Figure 15:
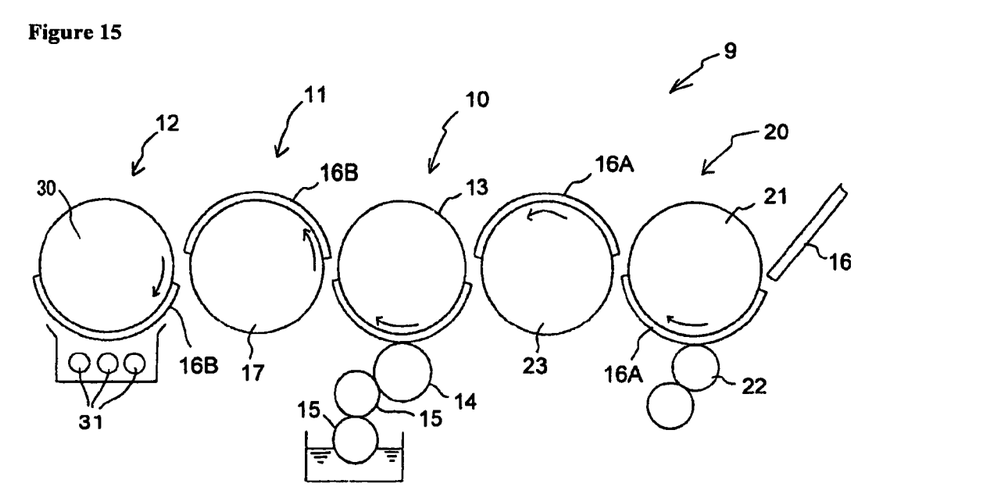
FIG. 15 is a schematic illustration showing an apparatus for pattern formation which is an example of the present invention.

As an example for implementing the method of the present invention, the major parts of the apparatus for pattern formation are schematically shown in FIG. 15. As shown in FIG. 15, an apparatus for pattern formation 9 has a pattern formation resin applying section 10 for applying a resin for pattern formation to a bottom surface of a base member in a state in which the bottom surface of the base member is placed face down, a base member conveying section 11 for moving the base member to which the resin for pattern formation has been applied, in a state in which the applied surface is placed face down, and a curing section 12 for forming patterns by curing the resin for pattern formation that has been applied to the bottom surface of the base member. A pattern formation partition line applying section 20 is placed before the pattern formation resin applying section 10.

The pattern formation partition line applying section 20 wraps a sheet 16, which is sent from a sheet feeding section for feeding stored sheets, around a roller 21 to transfer the sheet 16, and at the same time forms, on a bottom surface of the sheet 16, a number of partition lines for pattern formation at predetermined intervals by means of a partition line transfer roller 22, and then sends out the sheet 16A, the bottom surface of which has the partition lines for pattern formation formed thereon, by means of a first roller 23. It should be noted that in the sheet 16 sent to the roller 21, an image may have been formed, by means of coating, on the side opposite to the surface on which the partition lines for pattern formation are formed. Moreover, in the case in which an image has not been formed, by means of coating, on the side opposite to the surface of the sheet 16 on which the partition lines for pattern formation are formed, the sheet 16 being sent to the roller 21, or a pattern-printed matter on which patterns are formed by the apparatus for pattern formation is sent to a printer for printing an image on the side opposite to the pattern-printed surface, whereby it is possible to produce a visually effective printed matter in which an image is formed on one side of the printed matter and patterns are formed on the other side of the same.

As shown in FIG. 15, the pattern formation resin applying section 10 has an impression cylinder 13, a blanket cylinder 14 that is disposed below the impression cylinder 13 and applies the resin composition for pattern formation to the pattern formation surface of the base member 1 to be conveyed by the impression cylinder 13, and a roller 15 that is in contact with the blanket cylinder 14 and supplies the resin composition for pattern formation to the blanket cylinder 14.

A sheet that is conveyed to the pattern formation resin applying section 10 may be, as shown in FIG. 1, a semi-printed sheet 16A that has the substrate 1, the image 2 formed on one side of the substrate 1, and a plurality of partition lines for pattern formation 5 formed on a surface opposite to the surface formed with the image 2. An example of the semi-printed sheet 16A is described hereinafter.

The sheet 16A is conveyed to the impression cylinder 13 in a state in which the surface formed with the partition lines for pattern formation 5 is placed face down. The impression cylinder 13 attaches the sheet 16A to the drum surface thereof and conveys the sheet 16A as the impression cylinder 13 rotates, and the resin composition for pattern formation is applied to the pattern formation surface of the sheet 16A at the blanket cylinder 14.

The base member conveying section 11 is formed so as to convey the sheet 16A in a state in which the pattern formation surface is placed face down, the sheet 16A being conveyed by the impression cylinder 13 and having the pattern formation resin composition applied to the pattern formation surface thereof.

The base member conveying section 11 may have any structure as long as it is formed so as to be able to convey a printed sheet 16B, which has the uncured resin composition for pattern formation applied to the faced-down pattern formation surface thereof, to a next curing section 12 in a state in which the surface coated with the resin composition for pattern formation is placed face down.

In this base member conveying section 11, during a period in which the printed sheet 16B is conveyed to a conveying cylinder 17, the surface coated with the resin composition for pattern formation is placed face down, and the peripheral surface of the conveying cylinder 17 and the applied resin composition for pattern formation are prevented from contacting with each other, thus, as shown in FIG. 13, the resin composition repelled by the partition lines 5 is held between adjacent partition lines 5 on the bottom surface of the base member 1 by gravity and surface tension of the resin composition so as form a downward convex catenary or a cross-sectional outline of a catenary.

The curing section 12 has: a conveying second cylinder 30 that conveys the printed sheet 16B, which is conveyed in a state in which the bottom surface of the printed sheet 16B is placed face down, i.e. in a state in which the partition lines for pattern formation 5 formed on the surface of the base member 1 are positioned face down; and, for example, a mercury lamp 31 as light irradiation means, which cures the resin composition for pattern formation that forms the convex pattern 7 on the printed sheet 16B held on the peripheral surface of the conveying second cylinder 30.

The curing section 12 cures the resin composition for pattern formation applied to the base member, i.e. the printed sheet 16B, which is conveyed in a state in which the resin composition for pattern formation applied to the surface of the faced-down base member, or printed sheet 16B, is held on the bottom surface of the base member, or the printed sheet 16B. In the apparatus for pattern formation 9, the printed sheet 16B is conveyed by the conveying second cylinder 30 of the curing section 12 and at the same time the mercury lamp 31 emits light, whereby the resin composition for pattern formation, which has a curved surface formed by a combination of actions of both surface tension of the uncured resin composition for pattern formation and gravity, is cured, and the solidified pattern 7 is formed.

The printed matter having an image on one side thereof and the solidified pattern 7 on the other side is discharged from the apparatus for pattern formation 9 without subjecting the surface having the image to further printing processing. When an image is already formed on one side of the sheet that is supplied to the apparatus for pattern formation 9, the printed matter discharged from the apparatus for pattern formation 9 is a visually effective printed matter that has special visual effects in which a moiré pattern, a three-dimensional image, and an image that changes when looked at from different angles can be observed when the image formed on one side of the base member is observed through the pattern.

Such special visual effects are suitably realized when the line width of the partition lines for pattern formation is set to, for example, 0.2 through 250 μm, each interval is set to, for example, 0.2 through 30 μm, and the thickness of the base member is set to, for example, 0.01 through 0.8 mm. Such special visual effects are realized by applying the resin composition for pattern formation to the pattern formation surface of the base member in a state in which the pattern formation surface is placed face down, and by curing the pattern thus obtained, having a curved surface, which is formed by both actions of surface tension of the resin composition for pattern formation and gravity, and cannot definitely be obtained only by applying the resin composition for pattern formation in a state in which the pattern formation surface of the base member is placed face up.

Second Embodiment

The difference between the method for pattern formation of the second embodiment and the method for pattern formation of the first embodiment is that the second embodiment has, in place of the first step of "applying, to partition lines for pattern formation that are formed on a surface of a base member, a resin composition for pattern formation that has small compatibility or substantially no compatibility with a resin for forming the partition lines for pattern formation" in the first embodiment, (1) a first step of forming a first undercoating layer on the surface of the base member, (2) a second step of forming a second undercoating layer on the surface of the first undercoating layer wherein said second undercoating layer has broken parts at predetermined intervals through which parts of the first undercoating layer are exposed, and (3) a third step of applying a resin composition for pattern formation that has small or substantially no compatibility with the first undercoating layer but has compatibility with the second undercoating layer, in a state in which the surface having the first undercoating layer and the second undercoating layer is placed face down. A step of (3) maintaining the state in which the surface of the base member applied with the resin composition for pattern formation is placed face down, and a step of (4) curing the resin composition for pattern formation formed into a predetermined pattern on the surface of the base member according to the method for pattern formation of the second embodiment are the same as the step of (2) maintaining the state in which the surface of the base member applied with the resin composition for pattern formation is placed face down, and the step of (3) curing the resin composition for pattern formation that is formed into a predetermined pattern on the surface of the base member according to the method for pattern formation of the first embodiment.

Figure 2:
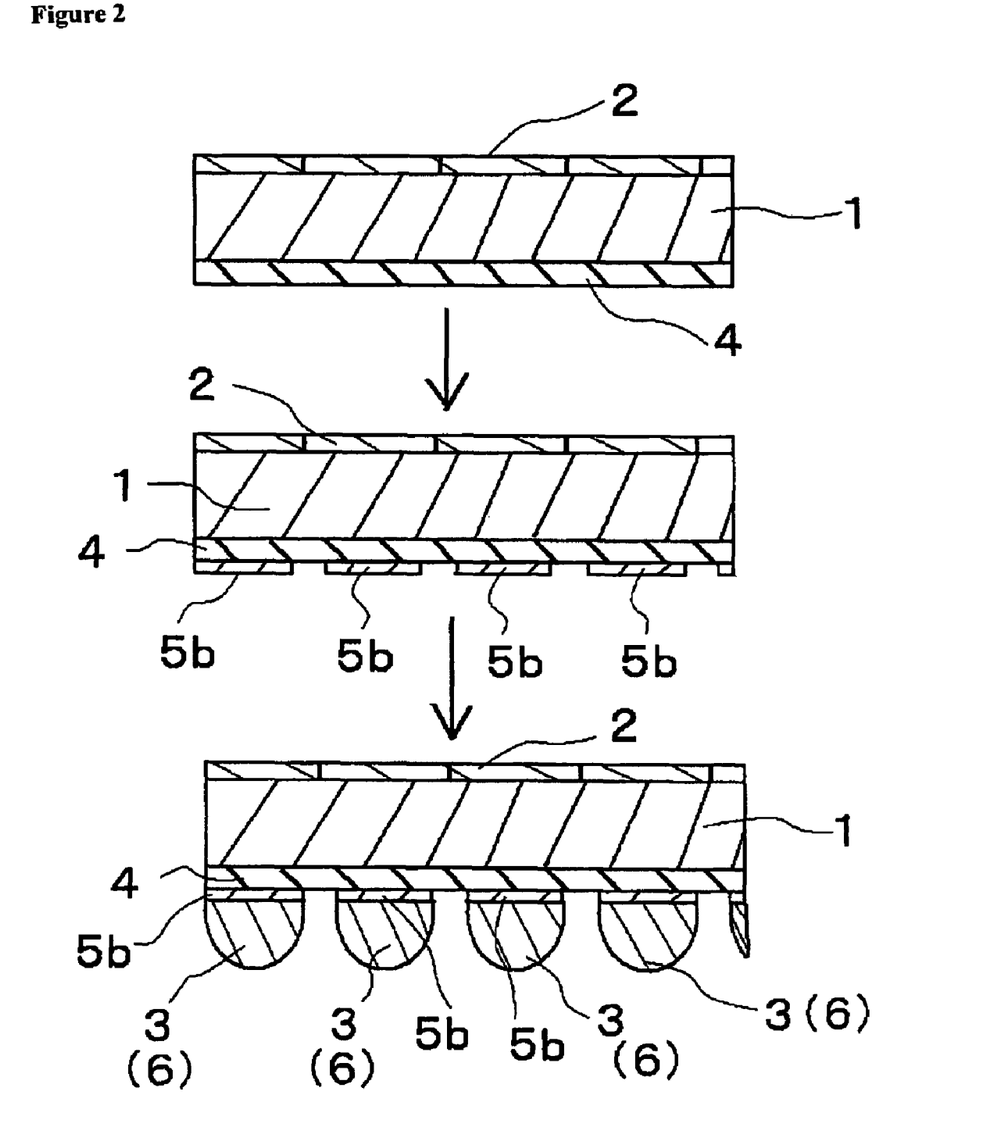
FIG. 2 is an explanatory diagram showing a procedure of the method for pattern formation according to another example of the present invention.

Specifically, in the first step in the second embodiment, as shown in FIG. 2, a first undercoating layer 4 is formed on a surface opposite to the surface of the base member 1 on which the image 2 is formed. Unlike the one shown in FIG. 2, the first undercoating layer 4 may be applied to the top surface of the base member 1 whose bottom surface is with the image 2 formed thereon. A known method for the application such as a roll coater can be employed as the method for applying the first undercoating layer.

In the second step in the second embodiment, as shown in FIG. 2, a second undercoating layer 5b is formed on the surface of the first undercoating layer 4. The second undercoating layer 5b is broken at regular intervals and the surface of the first undercoating layer is exposed through the broken parts.

In the third step in the second embodiment, as shown in FIG. 2, the resin composition for pattern formation 6 is applied in a state in which the surface of the base member 1 which has the first undercoating layer 4 and the second undercoating layer 5b is placed face down.

In the second embodiment, a material having an adhesiveness to the base member is preferably selected as a resin composition for the first undercoating layer for forming the first undercoating layer, a material having an adhesiveness to the resin composition for the first undercoating layer is preferably selected as the resin composition for the second undercoating layer for forming the second undercoating layer, and a material that has small or substantially no compatibility with the first undercoating layer but has good compatibility with the second undercoating layer is preferably selected as the resin composition for pattern formation.

How the resin composition for the first undercoating layer, the resin composition for the second undercoating layer, and the resin composition for pattern formation are made is determined appropriately in accordance with the type of the substrate, the type of the resin contained in the resin composition for pattern formation, the viscosity of the resin composition for pattern formation, and the curing speed.

When, in the third step, the resin composition for pattern formation 6 is applied in a state in which the surface of the base member 1 having the first undercoating layer 4 and second undercoating layer 5b is placed face down, the resin composition for pattern formation has small compatibility or substantially no compatibility with the first undercoating layer, thus the resin composition for pattern formation is repelled, whereby the resin for pattern formation is not suspended on the parts of the first undercoating layer exposed through the broken parts of the second undercoating layer, as shown in FIG. 2. However, the resin composition for pattern formation has good compatibility with the second undercoating layer, thus the resin composition for pattern formation is suspended on the bottom surface of the non-broken parts of the second undercoating layer, in a state in which the resin composition has a curved surface formed due to both actions of the surface tension of the resin composition and gravity, whereby the patterns 3 are formed.

While the patterns 3 of the resin composition for pattern formation are kept suspended on the second undercoating layer 5b, the resin composition for pattern formation is cured.

The same curing technique as the one described in the first embodiment is performed.

Figure 16:
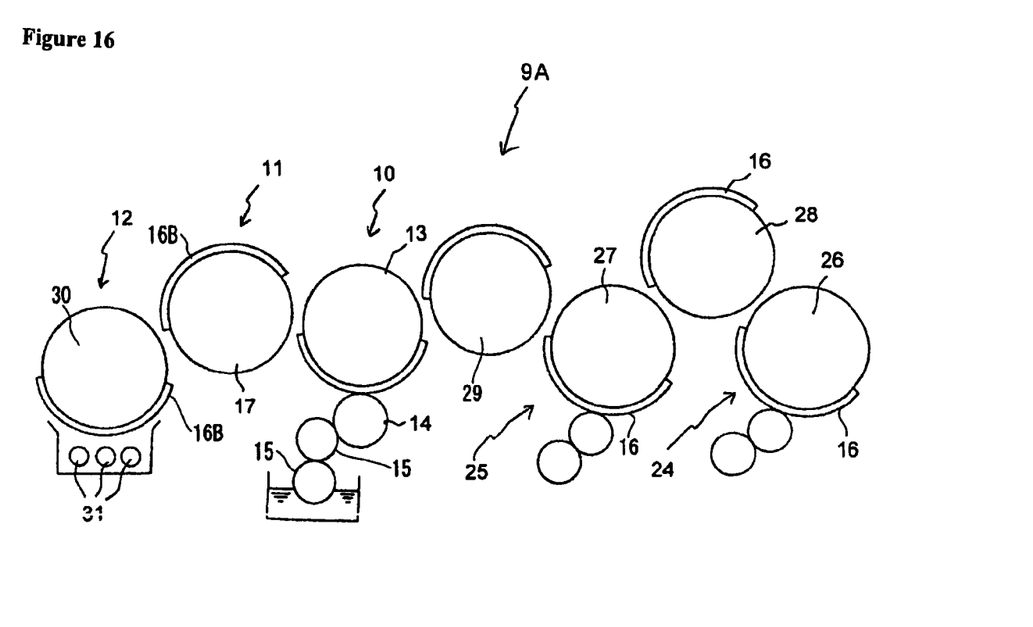
FIG. 16 is a schematic illustration showing an apparatus for pattern formation which is another example of the present invention.

In order to apply the resin composition for pattern formation in a state in which the second undercoating layer 5b is placed face down, it is preferred to use an apparatus for pattern formation 9A as shown in FIG. 16.

The apparatus for pattern formation 9A has a first undercoating layer forming section 24, a second undercoating layer forming section 25, the pattern formation resin applying section 10, the base member transferring section 11, and the curing section 12. The pattern formation resin applying section 10, the base member transferring section 11, and the curing section 12 are the same as those of the apparatus for pattern formation 9 described in the first embodiment.

The first undercoating layer forming section 24 wraps a sheet 16, which is sent from the sheet feeding section for feeding stored sheets, around a roller 26 to transfer the sheet 16, and at the same time applies the resin composition for the first undercoating layer onto the bottom surface of the sheet 16. The second undercoating layer forming section 25 wraps the sheet 16, the bottom surface of which is coated with the first undercoating layer, around a roller 27 to transfer the sheet 16, and at the same time applies the resin composition for the second undercoating layer onto the surface of the first undercoating layer at predetermined intervals, and then sends the sheet with the second undercoating layer to the pattern formation resin applying section 10. It should be noted that the reference numerals 27, 28 and 29 in FIG. 16 represent feed rollers.

In the apparatus for pattern formation 9A, as in the apparatus for pattern formation 9, the sheet that passes through the curing section 12 is discharged as a pattern-printed matter without having pattern printed on the surface thereof.

In the method for pattern formation according to the second embodiment, as in the method for pattern formation according to the first embodiment, the resin composition for pattern formation, which is provided with a curved surface formed by a combination of actions of both surface tension and gravity of the uncured resin composition for pattern formation, is cured, whereby a pattern-printed matter having a solidified pattern 7 formed thereon can be obtained.

Hereinbefore the present invention has been described in detail, with the first embodiment and the second embodiment of the present invention disclosed, but the present invention is not limited to the first embodiment and the second embodiment. The target object to be subjected to pattern formation by the apparatus for pattern formation is a sheet, but a long roll paper may be used.

INDUSTRIAL APPLICABILITY

The present invention can provide a method for pattern formation which can obtain special visual effects such as the stereoscopic effect and the moiré effect when observing, through a pattern, an image formed on a base member, a method for pattern formation which can be applied to a charge coupled device image sensor, a liquid crystal display, a plasma display, an organic EL display device and the like, and an apparatus for pattern formation.

The invention claimed is:

1. A method for pattern formation comprising: applying, between partition lines for pattern formation formed on a surface of a base member, a resin composition for pattern formation being repelled by a resin forming the partition lines for pattern formation by printing or coating, in a state in which the surface of the base member with the partition lines for pattern formation formed thereon is placed face down; maintaining the state in which the resin composition for pattern formation is held on the surface of the base member that is placed face down in order to form the resin composition for pattern formation applied between the partition lines for pattern formation into a downward convex shape; and curing the resin composition for pattern formation that is formed into the downward convex shape in order to form a pattern.

2. A method for pattern formation comprising: forming a first undercoating layer on a surface of a base member and then forming a second undercoating layer on a surface of the first undercoating layer, wherein said second undercoating layer has broken parts at predetermined intervals through which parts of the first undercoating layer are exposed; applying a resin composition for pattern formation that is repelled by the first undercoating layer but is not repelled by the second undercoating layer by printing or coating, in a state in which the surface of the base member having the first undercoating layer and the second undercoating layer is placed face down; maintaining the state in which the resin composition for pattern formation is held on the faced-down second undercoating layer in order to form the resin composition for pattern formation held on the second undercoating layer into a downward convex shape; and curing the resin composition for pattern formation that is formed into the downward convex shape in order to form a pattern.

3. The method for pattern formation according to claim 1 or 2, wherein the pattern is a convex lens.

4. The method for pattern formation according to claim 1, wherein the resin composition for pattern formation has a refractive index of 1.35 to 1.75.

5. The method for pattern formation according to claim 1, wherein the resin composition for pattern formation comprises 50 to 95 wt % of a polymerizable substance, 0 to 5 wt % of a contraction inhibitor and 1 to 15 wt % of a polymerization initiator.

6. The method for pattern formation according to claim 1, wherein the resin forming the partition lines for pattern formation is applied to the surface of the base member by printing.

* * * * *